United States Patent [19]

Kirsch et al.

[11] Patent Number: 4,679,172
[45] Date of Patent: Jul. 7, 1987

[54] DYNAMIC MEMORY WITH INCREASED DATA RETENTION TIME

[75] Inventors: Howard C. Kirsch, Emmaus; Frank J. Procyk, Center Valley, both of Pa.

[73] Assignee: American Telephone and Telegraph Company, AT&T Bell Laboratories, Murray Hill, N.J.

[21] Appl. No.: 738,664

[22] Filed: May 28, 1985

[51] Int. Cl.[4] .............................................. G11C 7/00
[52] U.S. Cl. .................................. 365/222; 365/205; 365/190
[58] Field of Search ............... 365/205, 207, 208, 190, 365/149, 222, 181, 233; 307/530

[56] References Cited

U.S. PATENT DOCUMENTS

| | | | |
|---|---|---|---|
| 4,204,277 | 5/1980 | Kinoshita | 365/203 |
| 4,447,892 | 5/1984 | Zibu | 365/156 |
| 4,475,178 | 10/1984 | Kinoshita | 365/203 |
| 4,551,641 | 11/1985 | Pelley, III | 365/205 |

FOREIGN PATENT DOCUMENTS

| | | |
|---|---|---|
| 0154547 | 9/1985 | European Pat. Off. . |
| 2454988 | 1/1976 | Fed. Rep. of Germany . |
| 0189898 | 11/1983 | Japan .................................. 365/205 |

OTHER PUBLICATIONS

Gray, "Three Level Word Line Pulse for Single FET Cell Arrays", IBM Technical Disclosure Bulletin, vol. 20, No. 5, pp. 1718-1719, Oct. 1977.

Primary Examiner—James W. Moffitt
Assistant Examiner—Glenn A. Gossage
Attorney, Agent, or Firm—James H. Fox

[57] ABSTRACT

A dynamic memory obtains reduced leakage currents through the access transistors by preventing the low-going column conductors from reaching zero volts for at least a majority of the duration of the active portion of a memory cycle. The low-going conductors are allowed to reach zero volts during the refresh operation. One advantage is a possible increase in the data storage time between required refresh operations. An increase in the refresh interval is especially useful for memory operations wherein a multiplicity of columns are selected for a given row selection. The present technique also addresses the tendency toward increased sub-threshold leakage as field effect transistor thresholds decrease.

11 Claims, 6 Drawing Figures

DYNAMIC MEMORY WITH INCREASED DATA RETENTION TIME

BACKGROUND OF THE INVENTION

1. Field of the Invention

The present invention relates to a dynamic memory integrated circuit wherein a reduced leakage of stored charge from a memory cell is obtained.

2. Description of the Prior Art

Dynamic random access memories (DRAMs) store information by placing a desired voltage on a storage capacitor, thereby charging or discharging the capacitor correspondingly. In the case of binary information, the stored voltage is nominally at one of two levels, referred to as the "1" and the "0" levels. In present generation designs, the 1 level is typically about 3.5 to 5 volts with respect to ground (VSS), and the 0 level is about 0 volts. It is also possible to store more than two voltage levels in a dynamic memory; see, for example, "A 16-Levels/Cell Dynamic Memory", M. Aoki et al, 1985 *IEEE International Solid-State Circuits Conference Digest of Technical Papers*, pages 246–247 (1985). In current designs, the charge is transferred into or out of the storage capacitor by means of an access transistor. The access transistor is typically a field effect transistor, wherein a voltage placed on the gate controls the conduction of charge through the channel between the source and drain electrodes.

Figure 1:
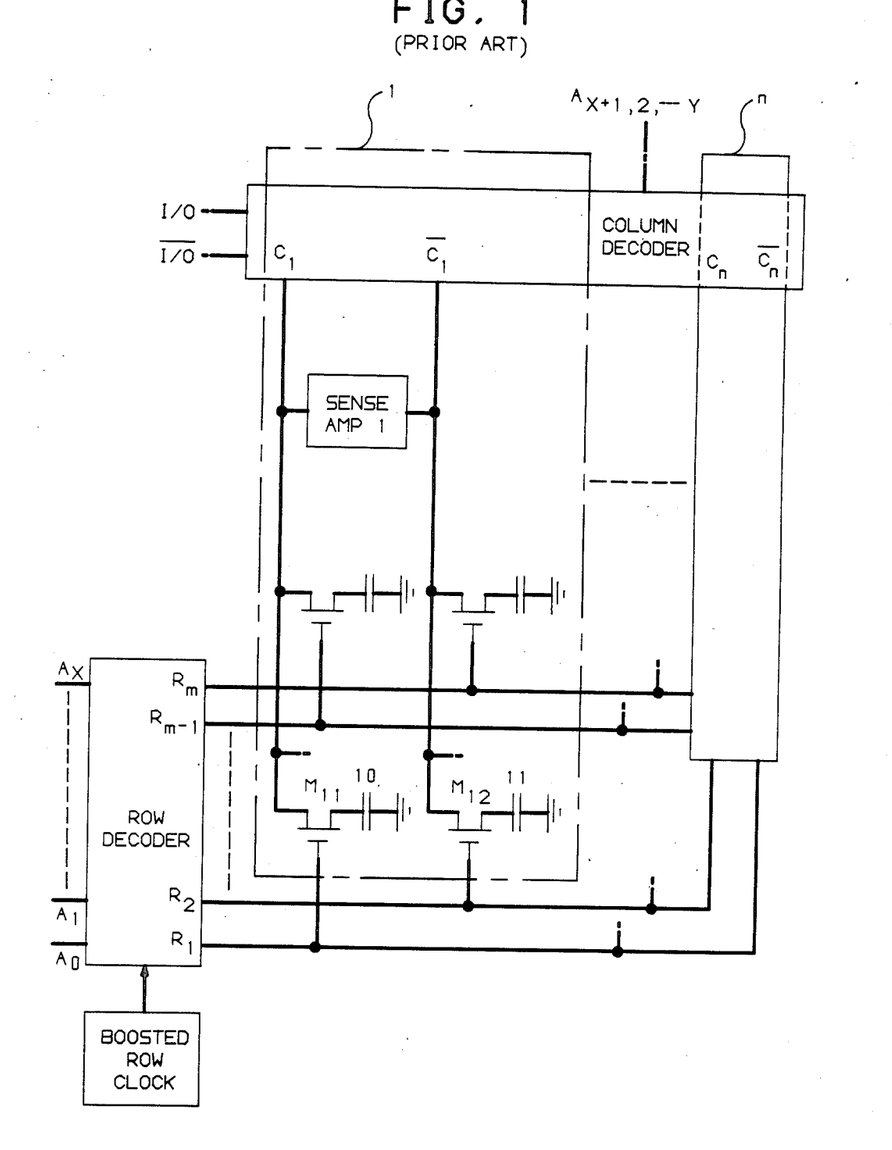
FIG. 1 illustrates a typical prior art memory array.

Referring to FIG. 1, a representative array of DRAM cells is illustrated. In many designs, a multiplicity of arrays are used on a given integrated circuit chip, or on a wafer in the case of wafer scale integration. Each of the arrays is then often referred to as a "sub-array". An array comprises a multiplicity of memory cells arranged in row and columns. Each cell comprises an information storage capacitor (e.g., 10) and an associated access transistor (e.g., M11). The gate of the access transistor is connected to a row conductor (e.g., R1), and a source-/drain electrode to a column conductor (e.g., C1). The other source/drain electrode of the access transistor is connected to one plate of the storage capacitor. Note that which of the transistor controlled electrodes serves as the source and which as the drain depends upon the voltage present on the storage capacitor and the column conductor at any given time.

A desired row of memory cells is selected for a read or write operation when the row decoder places the appropriate access voltage on a row conductor. This voltage allows the access transistors in the selected row to conduct, thereby allowing the column conductors to communicate with the storage capacitors along the selected row. Normally, a single row is selected at any one time in a given array, although a reference row may also be selected to access a dummy cell in the given array. A corresponding row (i.e., one specified by the same row address bits) may simultaneously be selected in another sub-array. Then, a column is selected by the column decoder for performing an input (write) or output (read) operation from the selected cell during the active portion of a memory cycle.

Dynamic memories by their nature require periodic refreshing of the information stored in the cells. This is due to leakage of charge stored in the capacitor. Such leakage may occur from a capacitor plate to the substrate, and also through the access transistor, among other ways. The latter phenomenon, referred to as "sub-threshold leakage" occurs because the channel of the field effect access transistor can never be rendered entirely non-conducting by the gate voltage. Therefore, a refresh voltage, usually supplied by the sense amplifier, is applied to the cell periodically. At present, the periodic refresh occurs about every 4 to 9 milliseconds in most designs. A refresh is also provided at the end of each memory cycle in typical designs.

Furthermore, some modes of memory access, such as "page mode" and "fast column", allow cells to be accessed at a number of desired locations along a selected row by merely performing repeated column access operations; see, for example, "A 1Mb CMOS DRAM", H. C. Kirsch et al, 1985 *IEEE International Solid-State Circuits Conference Digest of Technical Papers*, pp. 256–257. In these access modes the row decoding process need be accomplished only once, as long as the desired cells are located on the selected row. Hence, the active portion of the memory cycle may be very long in duration. These access modes place a premium on the length of time the cells may be accessed without a refresh, since a refresh may interrupt a high data rate read operation, and also may necessitate that the row decoding operation be performed again. However, the time interval before a required refresh during page mode or fast column or during long active cycles may be limited, because of leakage through the access transistor. Furthermore, in these modes the information hold time is less than in other access modes wherein the column conductors are precharged between cell accesses. This is because the voltage level of a precharged column conductor typically is such as to reduce the sub-threshold leakage through the access transistors connected thereto. Hence, the use of page mode, fast column mode, long active cycles, etc. make an increase in memory hold time desirable.

In addition, there is a trend toward lower operating voltages (i.e., less than 5 volts) for dynamic memories, due to the reduction in transistor sizes. This in turn makes a reduction in the access transistor threshold voltage (Vth) desirable for circuit reasons. However, the leakage current is a very non-linear function of threshold voltage, so that reduced thresholds allow increased leakage currents. Hence, it is desirable to obtain a dynamic random access memory that compensates for increased sub-threshold leakage.

SUMMARY OF THE INVENTION

We have invented a dynamic memory providing for reducing leakage currents through the access transistors. In the present technique, the voltage on a column conductor latched in the low voltage state is maintained at a voltage in excess of zero volts during the active portion of a memory cycle. In a preferred embodiment, a column conductor latched in the low voltage state is reduced to zero volts during a refresh operation.

DETAILED DESCRIPTION

The following detailed description relates to a dynamic memory having improved retention of data due to reduced leakage of charge through the access transistors of the memory cells. Referring to FIG. 1, in a typical memory array only a single row conductor (e.g., R1) is selected at a given time. The other row conductors (R2-Rm) remain unselected during a given memory access cycle. (As noted above, a multiplicity of column selections may occur before selecting another row, as in page mode operation.) During this row selection, the access transistors along row 1 are placed in the conducting state by a high voltage level on R1. In the case of n-channel access transistors as shown, this is a positive voltage (e.g., +5 volts) with respect to a reference ground potential VSS. On all of the other (unselected) row conductors in a given array, a low voltage (e.g., 0 volts) is present.

In a typical DRAM design, once the row conductor is selected, the sense amplifiers are all activated in a given array. This causes the sense amplifier in each column to sense the voltage level for the memory cell in that column that is located on the selected row. The sensed level is also "latched" in the sense amplifier for retention throughout the duration of the row selection. Note that each column typically comprises two column conductors connected to the corresponding sense amplifier for that column. As shown, the column conductors may be parallel, which is often referred to as a folded bit line. Alternately, the column conductors may extend in opposite directions from the associated sense amplifier. In either case, one conductor of the pair (the "true" conductor) carries the information from the selected cell, while the other conductor (the "complement" conductor) provides a reference potential for the sense amplifier during sensing. The complement conductor is then latched into the opposite voltage level as that of the true conductor by the sense amplifier.

The foregoing scheme results in half of the column conductors being latched in the high voltage state, and the other half being latched in the low voltage state, during the "active" and "refresh" portions of the memory cycle. The latching function is typically provided by the sense amplifiers. However, this does not have to be the case; the sensing and latching functions may be provided by separate means. Once latching occurs, the access transistors connected to the low column conductors and located on the unselected rows are particularly vulnerable to sub-threshold leakage. This is because a 1 (high voltage) level stored in a storage capacitor accessed by such a transistor will tend to discharge through the access transistor due to the sub-threshold leakage.

Figure 2:
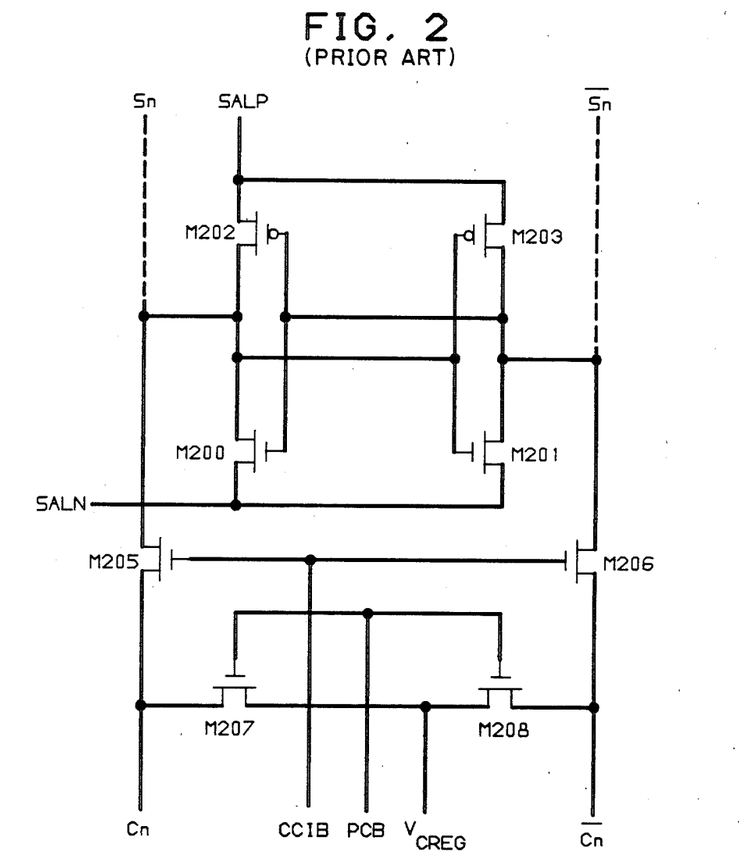
FIG. 2 illustrates a prior art sense amplifier suitable for use with the present invention.

The present invention substantially reduces sub-threshold leakage through the access transistors by maintaining the low-going column conductors at a voltage magnitude in excess of zero volts for a substantial portion of the active portion of a memory cycle. In an exemplary embodiment, this is achieved by control of a latching voltage applied to the sense amplifiers, with other schemes also being possible. Referring to FIG. 2, a sense amplifier suitable for use with the present invention is shown. The design of the sense amplifier per se is not critical, with other designs being possible. The column conductors Cn and $\overline{Cn}$ extend to the memory cells, located to the bottom of FIG. 2 as viewed. The conductors Sn and $\overline{Sn}$ connect to the column decoder located above the sense amplifier as viewed.

The lower portion of FIG. 2 includes precharge transistors M207 and M208. During the recovery portion of a memory cycle, a high voltage level PCB causes M207 and M208 to conduct. This shorts the column conductors Cn and $\overline{Cn}$ together, and also connects them to a regulated voltage VCREG. The value of VCREG is typically about one-half of the power supply voltage (VCC/2), but may be other values. After the precharge operation, PCB returns low. Other precharging schemes are possible. The column conductors Cn and $\overline{Cn}$ are coupled to the sense amplifier through partial decoupling devices M205 and M206. The gates of M205 and M206 are controlled by CCIB, which is boosted approximately one threshold above VCC. This helps to reduce the capacitive loading on the sense amplifier from Cn and $\overline{Cn}$, while still allowing the sensing of the stored voltage from the selected cell along the column. Other partial decoupling schemes are possible, or alternately may be omitted. The transistors M200-M203 form a conventional complementary (e.g., CMOS) cross-coupled bistable sense amplifier circuit, with other designs being possible, as noted above.

Figure 3:
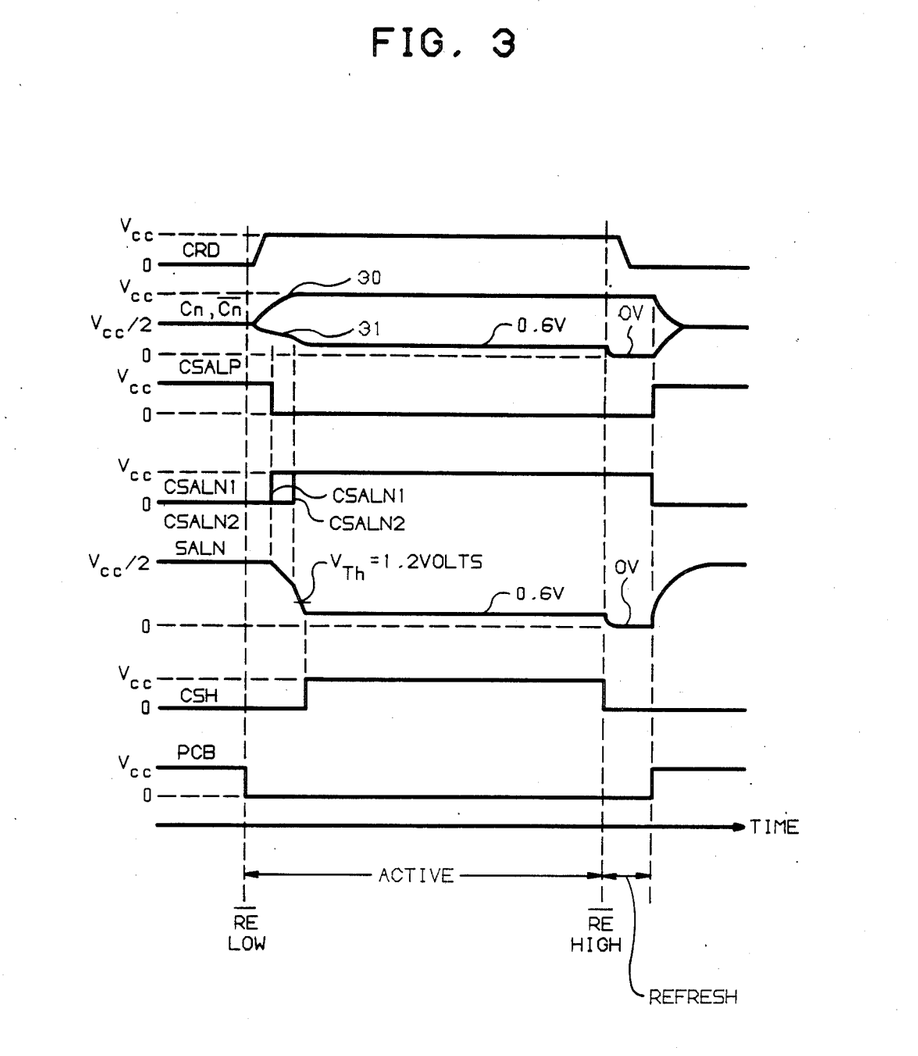
FIG. 3 illustrates signal voltages associated with implementing the present invention.

The control of the sense amplifier is by means of a positive latching signal SALP, and a negative latching signal SALN. In the exemplary embodiment, the SALN signal is used to control the minimum voltage on the column conductor that is being latched in the low state; this conductor is also referred to as the "low-going" column conductor herein. The SALN signal is shown in FIG. 3, along with the high-going column conductor voltage 30, and the low-going column conductor voltage 31. As shown, the voltage 31 is prevented from reaching 0 volts during the active portion of the memory cycle. This substantially reduces sub-threshold leakage through the access transistors on the unselected rows. This is because a relatively small increase in the source voltage, which causes the gate to source voltage Vgs to become more negative, greatly reduces the leakage current. For example, a 0.1 volt increase in the source voltage causes typically about an order of magnitude reduction in the leakage current. (In the case of p-channel access transistors, the source voltage is made more negative than the gate voltage to achieve this effect. Hence, if the low-going column conductor is prevented from dropping below 0.6 volts in an illustrative case, a negative Vgs of this amount is obtained on the unselected access transistors, since their gates are at 0 volts. Thus, a reduction of leakage currents therethrough of several orders of magnitude is obtained. In the present technique the column conductor may optionally reach 0 volts during the refresh portion of the memory cycle, to allow full refresh of a 0 level in the cells storing a 0.

Figure 4:
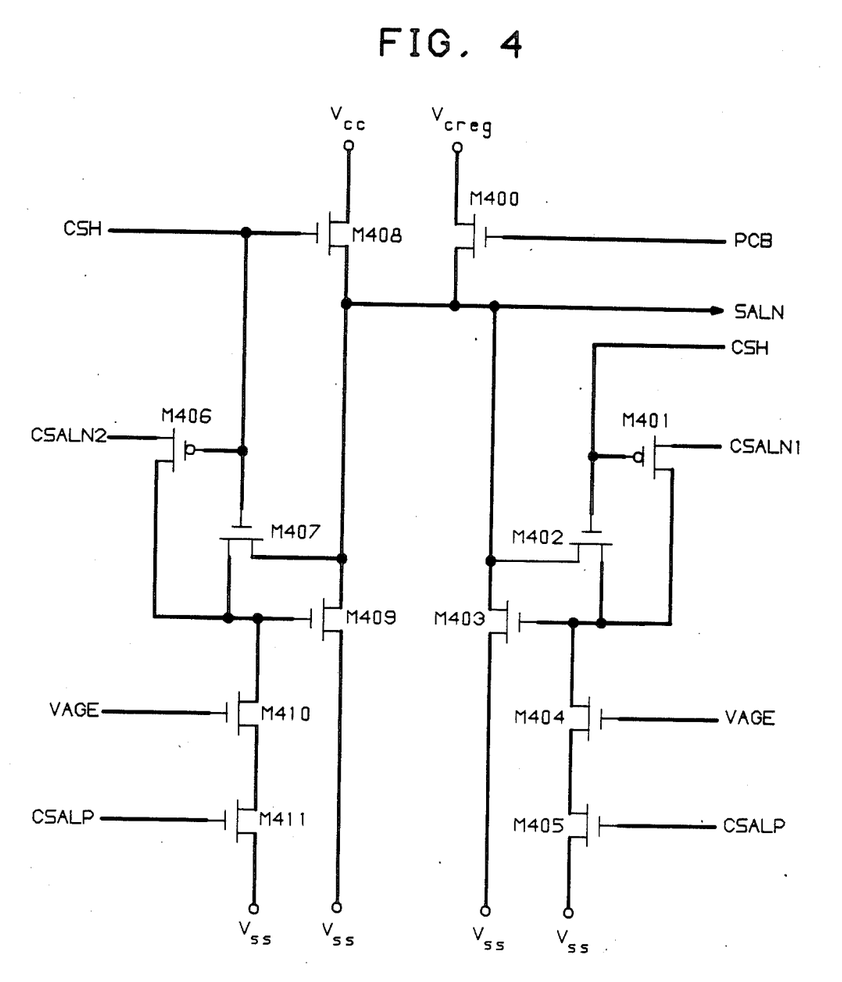
FIGS. 4–6 illustrate sense amplifier control circuitry suitable for implementing the present invention.

A circuit suitable for control of SALN is shown in FIG. 4. Transistor M400 charges the SALN node to VCREG when PCB goes high during the recovery period at the end of a memory cycle. The next memory cycle is initiated when the $\overline{RE}$ signal goes low, which starts the row decode operation. Referring also to FIG. 3, it is seen that the column conductors Cn, $\overline{Cn}$ of a given column at first begin to slowly diverge from the precharge voltage (VCC/2) as the charge stored in the selected cell is transferred onto the associated column conductor. After a fixed delay from $\overline{RE}$ low to allow for row selection, the CRD signal goes high to select a row. Typically 20 to 25 nanoseconds thereafter in current designs, the CSALP signal goes low. The delay is included to allow the row conductor selection voltage to reach the cells farthest from the row decoder. The CSALP signal is inverted to generate a positive (e.g., +5 volt) voltage on the SALP node of the sense amplifier (FIG. 2). The CSALP signal is also inverted to generate the CSALN1 signal, and after a fixed delay of typically about 10 to 15 nanoseconds, a CSALN2 signal. The CSALN1 high signal is applied to the source of M401, whose gate is held low by signal CSH. Hence, a high signal is transmitted to the gate of M403, causing it to conduct. M403 is a relatively low gain device, and serves to weakly pull node SALN toward the zero voltage (VSS) level. After the above-noted delay, the CSALN2 high signal is applied to the source of M406, and transmitted to the gate of M409. Transistor M409 is a relatively higher gain device than M403, and serves to more strongly pull the SALN node toward zero volts. The use of multiple devices to thus pull SALN toward VSS is known in the art, with other techniques being possible.

In accordance with the present invention, the SALN node is prevented from reaching zero volts (VSS) during the active portion of the memory cycle. To accomplish this, the SALN voltage is applied to a complementary inverter comprising a p-channel transistor M500 and n-channel transistor M502; see FIG. 5. Also included is an optional protective transistor M501 that reduces the voltage across M502. The gate voltage VAGE is typically about 5.5 volts for devices having a threshold of about 1.2 volts, thus limiting the voltage on M502 to about 4.3 volts. When the CRD signal is high (FIG. 3), the inverter M500–M502 output switches high when SALN drops below the inverter switching threshold. This threshold is set at about the transistor threshold (Vth) of M502 by making M502 a relatively higher gain device than M500. Capacitor C500 adds delay to the switching of the next inverter. After subsequent inversions through the other complementary inverters in order to increase the drive capability and add delay, the node CSH assumes a high voltage level. Referring again to FIG. 4, the high CSH signal turns off transistors M401 and M406, removing the positive turn-on voltage from pull-down transistors M403 and M409. Furthermore, transistors M402 and M407 are turned on, which shorts the gate-drain electrodes of pull-down transistors M403 and M409, thereby ensuring they turn off. A weak pull-up transistor, M408, is also turned on by CSH. The net effect is to catch SALN as it passes Vth; see FIG. 3. This prevents SALN from reaching 0 volts, although a momentary overshoot may carry it lower than Vth.

Figure 6:
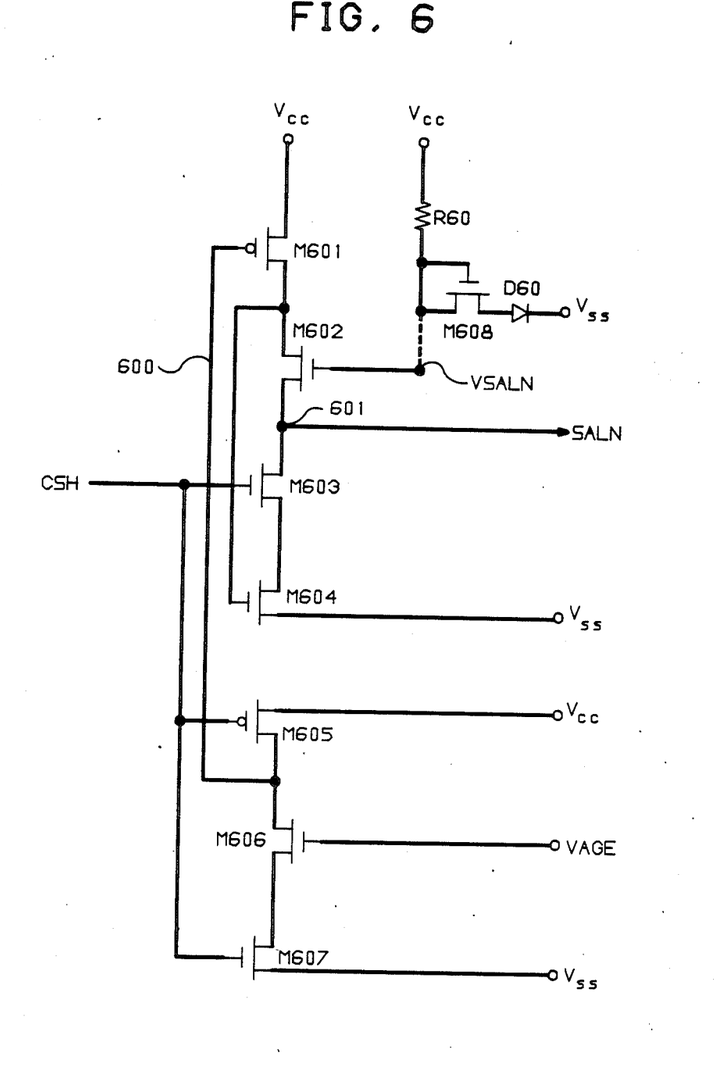

FIG. 6 illustrates a circuit suitable for maintaining SALN, and hence the low-going column conductor, at a voltage in excess of zero volts for the remaining portion of the read operation. When CSH goes high, M605 is turned off and M607 is turned on, placing node 600 in a low voltage state by conduction through protective transistor M606. This turns on M601, which then turns on M604. Note that M603 is also turned on by CSH. A regulated voltage, VSALN, is maintained on the gate of M602. This voltage has a value equal to the desired minimum value for SALN, plus the amount of a threshold voltage drop across M602, Vth. For example, if SALN is to be maintained at 0.6 volts, and if Vth=1.2 volts for M602, then VSALN is set to be 1.8 volts. A convenient method of obtaining VSALN is by the use of a diode-connected field effect transistor (M608) similar in type and characteristics to M602 connected in series with a band-gap voltage regulator, (R60-D60) as shown. Other regulator types are well known in the art. The voltage at the source of M602 is then the gate voltage (1.8 volts) minus the threshold voltage (1.2 volts), and thus the desired 0.6 volts. While the 0.6 volt value is thus conveniently obtained from a p-n bipolar junction voltage drop, other values are suitable. For example, a significant reduction in the sub-threshold leakage of the access transistors is obtained for minimum column conductor voltages of 0.1 volts, or even less. On the other hand, the minimum voltage should be less than the column precharge voltage, to allow proper sensing and latching by the sense amplifier. Thus, minimum values for the column conductor voltage in the range of 0.1 to 1.5 volts are typical, with a still wider range being possible.

The transition of $\overline{RE}$ to a high state signals the end of the active (read/write) portion of the memory cycle, and initiates the recovery operation. The recovery includes the refreshing of information in the memory cells along the selected row. To facilitate refreshing a 0 voltage level in cells storing a "0", the present technique optionally provides for setting SALN, and hence the low-going column conductor, to 0 volts during refresh; see FIG. 3. For this purpose, CSH goes low when $\overline{RE}$ goes high. Referring to FIG. 4, the CSH low transition turns on the pull-down transistors M409 and M403 by causing M406 and M401 to conduct, and also turns off M408. This action allows SALN, and hence the low-going column conductor, to reach zero volts (VSS). When the CSALP signal is high (FIG. 3), transistor M411 conducts. This clamps the gate of M409 to ground (VSS), preventing it from conducting, and hence from discharging SALN (and the column conductors). Note that M411 is also protected by optional protective transistor M410.

Figure 5:
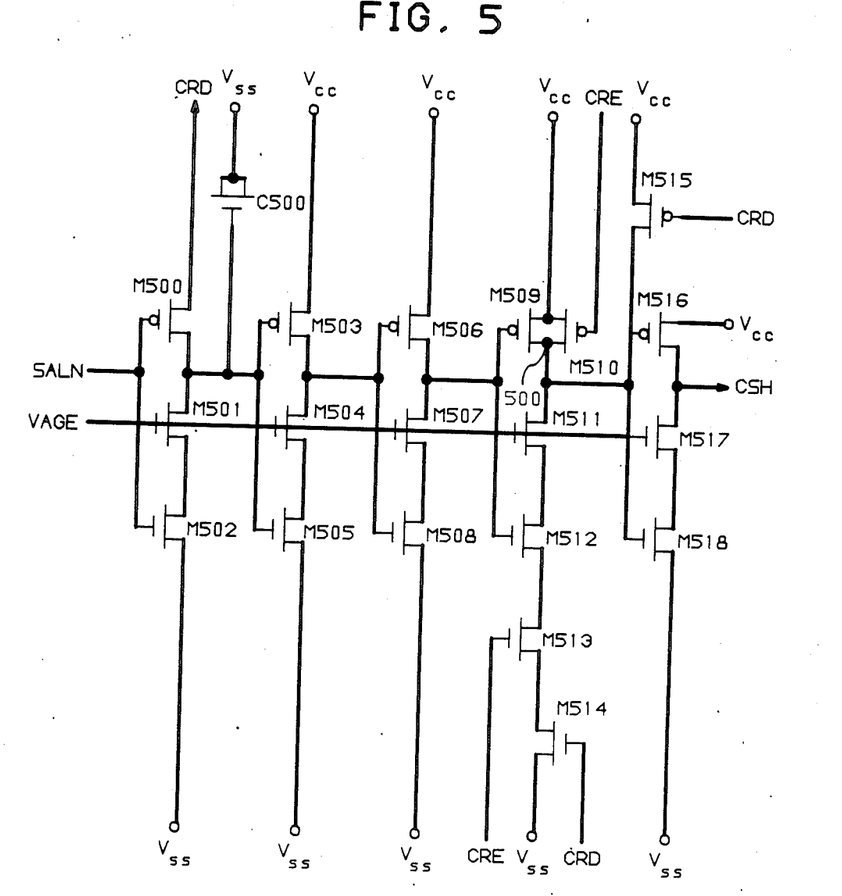

The low CSH signal also turns off the voltage reference circuit (FIG. 6) by turning off M603 and M607, and turning on M605, which places a high voltage level on node 600, thus turning M601 off. As a result, the SALN voltage at node 601 is allowed to assume the level set by the other circuitry connected thereto. As noted, the CSH low transition occurs when $\overline{RE}$ goes high. Referring to FIG. 5, this is conveniently accomplished with a CRE signal applied to the gates of M513 and M510, where CRE is an inverted signal derived from $\overline{RE}$. The CRE low signal then turns off M513 and turns on M510, placing node 500 high, and hence causing CSH to go low due to inverter M516-M518.

After the refresh operation is completed, the clocked row decode signal, CRD, goes low; see FIG. 3. This initiates the precharge operation, wherein the SALN and SALP nodes, and also the column conductors, are returned to the precharge level (VCC/2). As noted above, the CSALP signal is delayed from CRD by about 30 to 40 nanoseconds. Also, a high PCB signal causes M400 to conduct, thus precharging the SALN node to VCREG; see FIG. 4. A similar circuit (not shown) precharges the SALP node to VCREG also. As indicated in FIG. 2, the high PCB signal also charges column conductors Cn and $\overline{Cn}$ to VCREG. The circuits are thus ready for the initiation of the next row decode operation.

The above technique thus reduces sub-threshold leakage through the access transistors, while allowing a full zero level to be refreshed. However, if a full zero refresh is not necessary to maintain adequate signal margins, the low-going column conductor may remain at the level in excess of zero (e.g., 0.6 volts) established during the active portion of the memory cycle. Also, some circuit implementations of the present technique may allow the column conductors to initially reach zero volts, as may be due to overshoot of the low-going column conductor during the sense amplifier latching operation. Then, the column conductors are returned to the chosen level in excess of zero volts. It is apparent that the reduction in sub-threshold leakage currents will be approximately proportional to the time the low-going column conductor is maintained at the excess voltage level, as compared to the total latched time during a memory cycle. By maintaining the excess voltage level for at least a majority of the latched time during the active portion of a memory cycle, a significant reduction in leakage current may be obtained. As used herein, the term "latched time" excludes the time from the precharge level to the steady-state latched level when $\overline{RE}$ goes low.

A write operation may be provided by conventional techniques, wherein a write enable signal (e.g., $\overline{WE}$ low transition) allows the input/output lines to input information into a memory cell selected as above. The low-going column conductor of a selected column is desirably maintained at a voltage in excess of zero volts (e.g., 0.6 volts) during a write operation also. If a "0" level is written into the selected cell, the full 0 volts will be stored in the cell during the refresh portion of the memory cycle, assuming the optional zero volt level is established during refresh. It is alternately possible to simply treat the level in excess of zero volts (e.g., 0.6 volts) as the "0", and avoid the necessity to store or refresh a full zero volt level, if cell design margins permit.

Note that n-channel access transistors have been illustratively shown herein, wherein "zero volts" is typically the most negative power supply voltage applied to the memory array (although a still more negative back-gate bias voltage may be applied to the integrated circuit substrate). The present technique may also be used with p-channel access transistors. In that case, "zero volts" as used herein is typically the most positive power supply voltage applied to the memory array. In either case, the voltage applied to the unselected row conductors during an access operation (and to all the row conductors at times other than during access and refresh operations) may be used to define the zero volt level. This definition may require a re-labelling of voltage as compared to those normally applied to an integrated circuit chip. Also, in the case of a p-channel access transistor, the term "in excess of zero volts" then means a voltage more negative than zero volts. As is also apparent, the terms "low voltage level" and "high voltage level" then refer to the reverse polarity for the p-channel case as compared to the n-channel case.

While conventional memories, as illustrated in FIG. 1, typically utilize a column decoder, the present technique may also be advantageously used in memories without a column decoder. For example, all of the columns of a selected row may be accessed by multiple I/O lines simultaneously, without the necessity of selecting a given column for connection to a single I/O line. Furthermore, the cell selection capability need not be "random", but rather may select rows (and columns) in an invariant sequence, as may be useful in certain types of video screen display applications, among other uses. Also, while column conductors are typically arranged in pairs as noted above, with half of the memory cells in a column connected to one conductor and the other half connected to the other conductor, that arrangement is not necessary for use of the present invention. For example, a sense amplifier may be connected to all of the cells in a given column by a single column conductor. If the sense amplifier is a differential type, then a reference voltage (e.g., VCC/2) may be supplied thereto for comparison to the selected column conductor voltage. Other sense amplifier types are also possible. While the reduced cell leakage has been described for increasing memory information hold times, other tradeoffs are possible, such as ease of design or manufacture of the memory cells, or a reduction in cell size, or increase in wafer yield, etc.

What is claimed is:

1. An integrated circuit dynamic memory comprising memory cells arranged in rows and columns, and row decoding means for selecting a row of said cells by applying a voltage to a row conductor; wherein said cells comprise an access transistor having a control electrode connected to a row conductor, a first controlled electrode connected to an information storage capacitor, and a second controlled electrode connected to a column conductor; and further comprising means for latching a column conductor in a low voltage state in response to a voltage level stored in a memory cell, CHARACTERIZED IN THAT:

said integrated circuit further comprises means for maintaining the voltage on a column conductor that is latched in the low voltage state at a level in excess of zero volts for at least a majority of the active portion of a memory cycle, and still further comprises means for reducing the voltage on said column conductor latched in the low voltage state to essentially zero volts during a refresh operation.

2. The integrated circuit of claim 1 further comprising column decoding means adapted to select a desired column in response to a column address applied thereto.

3. The integrated circuit of claim 1 wherein said access transistor is an n-channel field effect transistor, and said voltage in excess of zero volts is a positive voltage.

4. The integrated circuit of claim 1 wherein said access transistor is a p-channel field effect transistor, and said voltage in excess of zero volts is a negative voltage.

5. The integrated circuit of claim 1 wherein the voltage on an unselected row conductor is defined to be zero volts.

6. The integrated circuit of claim 1 wherein said level in excess of zero volts is maintained for at least a majority of the duration of a write operation.

7. The integrated circuit of claim 1 wherein said level in excess of zero volts is maintained for at least a majority of the duration of a read operation.

8. The integrated circuit of claim 1 wherein said level in excess of zero volts has a magnitude in the range of from 0.1 to 1.5 volts.

9. The integrated circuit of claim 8 adapted to select a multiplicity of columns in response to a multiplicity of column addresses applied thereto during a given row selection.

10. The integrated circuit of claim 1 wherein some of the memory cells in a given column are connected to a first column conductor, and the other of the memory cells in the given column are connected to a second column conductor, whereby the first and second column conductors form a column conductor pair.

11. The integrated circuit of claim 10 wherein said means for maintaining said voltage in excess of zero volts comprises a cross-coupled sense amplifier coupled to said column conductor pair, wherein said sense amplifier has a first powered node maintained in a high voltage state during said latching, and a second powered node maintained at a low voltage state that is substantially equal to said level in excess of zero volts for said at least a portion of a memory cycle.

* * * * *